(12) United States Patent
Alvarez et al.

(10) Patent No.: US 6,372,368 B1
(45) Date of Patent: Apr. 16, 2002

(54) SUPERCONDUCTING REGULAR CURRENT INTERVAL VOLTAGE STEP ELEMENT AND SUPERCONDUCTING DEVICE

(75) Inventors: Gustavo Adolfo Alvarez; Youichi Enomoto, both of Tokyo (JP)

(73) Assignee: International Superconductivity Technology Center, Tokyo (JP)

( * ) Notice: Subject to any disclaimer, the term of this patent is extended or adjusted under 35 U.S.C. 154(b) by 0 days.

(21) Appl. No.: 09/110,173

(22) Filed: Jul. 6, 1998

(30) Foreign Application Priority Data

Jul. 7, 1997 (JP) .............................................. 9-181259

(51) Int. Cl.[7] .......................... H01B 12/00; H01F 6/00; H01L 39/00
(52) U.S. Cl. ...................... 428/697; 428/699; 428/701; 428/702; 505/190; 505/238; 505/702
(58) Field of Search ............................... 428/610, 699, 428/701, 702, 930; 505/190, 238, 329, 702; 257/32, 33, 35; 310/52

(56) References Cited

U.S. PATENT DOCUMENTS 5,047,390 A * 9/1991 Higashino et al. ............. 505/1
6,011,981 A * 4/2000 Alvarez et al. ............. 505/190

OTHER PUBLICATIONS

Badaye et al. High–quality c–axis oriented superconducting Nd1+xBa2–xCu3O7–d thin films deposited by laser ablation method. Appl. Phys. Lett. 66(16), Apr. 17, 1995. pp. 2131–2133.*

Alvarez et al. C–axis tunneling in multilayers Nd1+xBa2–xCu3O7–☐ junctions with Pr1+xBa2–xCu3O7–☐ barriers. Appl. Phys. Lett. 69(19), Oct. 28, 1996. pp. 2743–2745.*

Alvarez et al. Growth and Properties of Nd1+xBa2–xCu3O7–☐/Pr1+xBa2–xCu3O7–☐ Quasi–Homostructures for the Fabrication of Electronic Devices IEEE Trans. On Appl. Superconductivity, vol. 7, No. 2, Jun. 1997. pp. 3017–3020.*

* cited by examiner

*Primary Examiner*—Deborah Jones
*Assistant Examiner*—Stephen Stein
(74) *Attorney, Agent, or Firm*—Armstrong, Westerman & Hattori, LLP

(57) ABSTRACT

An oxide superconducting element is formed on a substrate 10 by a layered structure 30 formed of oxide superconducting thin-film and a non-superconducting thin-film layers. The element is a superconducting regular current interval voltage step element. The current-voltage characteristic curve in a magnetic field has a voltage step being generated at regular bias current intervals. The layered structure 30 is formed by depositing alternately M'Ba$_2$Cu$_3$O$_7$ (M' is one or a combination of more than two elements of Nd, Sm and Eu) and M"Ba$_2$Cu$_3$O$_7$ thin-films (M" is either Pr or Sc, or a combination of the two elements).

5 Claims, 6 Drawing Sheets

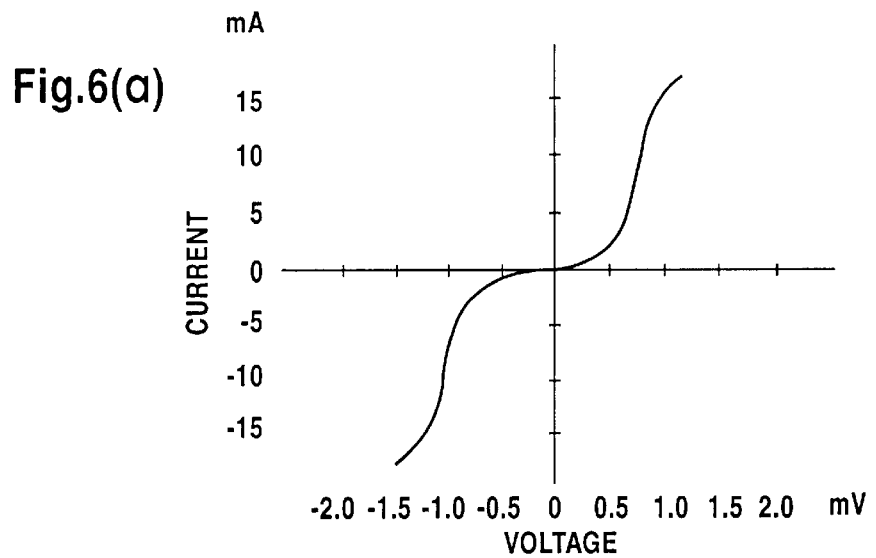
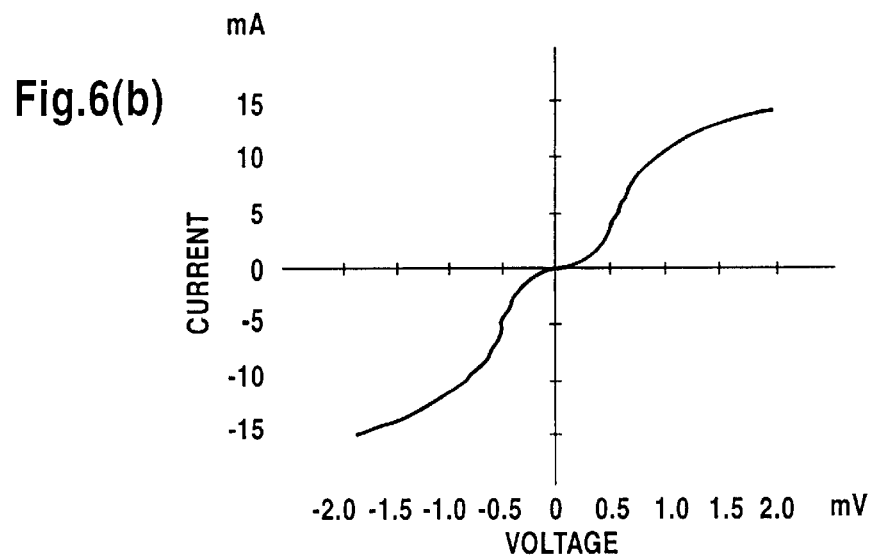
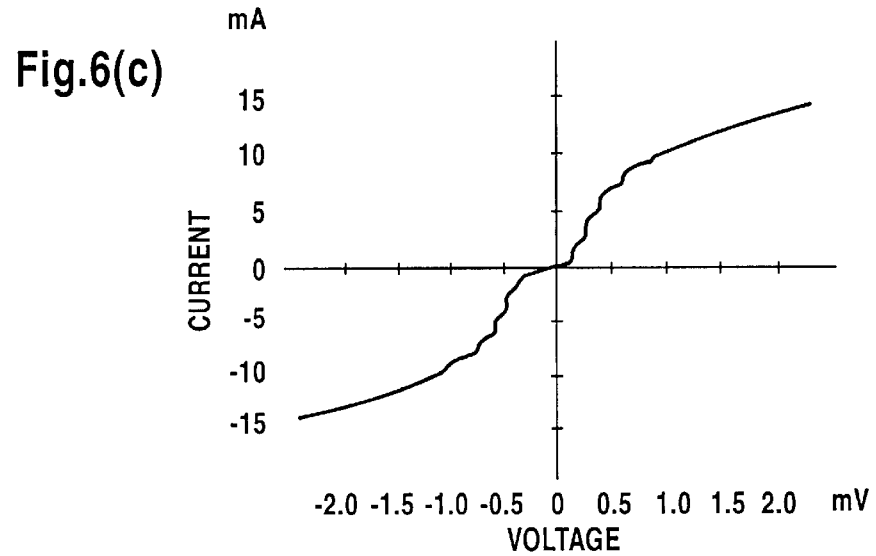

SUPERCONDUCTING REGULAR CURRENT INTERVAL VOLTAGE STEP ELEMENT AND SUPERCONDUCTING DEVICE

BACKGROUND OF THE INVENTION

The present invention is related to an oxide superconducting element and a superconducting device, and more particularly, to a superconducting element and a superconducting device for use in a high-speed circuit, a highly sensitive sensor, a current standard value determination and the like.

Superconducting tunneling is a phenomenon that appears by a quantum effect, and it is strongly considered for applying the quantum phenomenon to an electronic device. A tunnel-type Josephson element, which is one example thereof, is conventionally formed of a superconducting material such as Pb, Nb, NbN and the like. As a tunnel barrier, an oxide of the superconducting materials such as PbO and $Nb_2O_3$, or materials other than superconducting materials such as Al, $Al_2O_3$, MgO, $SiO_2$ and the like are used. The tunnel-type Josephson element being formed of such material show advantageous characteristics, and the application to superconducting memory, logic circuit, magnetic field sensor, and millimeter wave detection are promoted. However, such material systems show a low superconducting critical temperature below 15 K, and the cooling to a cryogenic temperature is necessary. The cost for performing such cooling is high, and the necessary equipment is large, so such superconducting materials could not be used easily. The characteristics of such materials under a weak magnetic field was studied and applied.

In the High Tc oxide superconductors, not only it is expected to reach a superconducting critical temperature Tc above the liquid nitrogen temperature, but it is also expected a phenomenon related to a physics of strong correlation or strong anisotropy. Therefore, studies aimed at tunnel-type elements are in progress. High Tc oxide superconductors have a layered crystal structure, with an intrinsic coupling characteristic being observed. From the point of view of relation to the superconducting structure, many studies are performed on the layered thin-film.

However, regarding the tunnel junction element utilizing an oxide superconducting material being manufactured artificially, reports are made only on the manufacturing of weak coupling-type elements having a difficult control characteristics, but no report is found so far regarding the tunnel-type element having an advantageous control characteristics. The reason for this is considered to be that the coupling between the superconducting electrodes are weakened since the manufacturing temperature of the oxide superconductor thin-film is above 700° C., the mutual diffusion between the barrier layer causes deterioration, and the coherence length is short.

In order to realize a layered structure, it is advantageous to combine the same kind of material from a crystal growth point of view. Many results are reported where a $PrBa_2Cu_3O_7$ having a similar crystal structure but showing no superconductivity is selected against a superconductor having a 123 structure, represented by a $YBa_2Cu_3O_{7-d}$.

However, screw dislocations caused by strain were observed when using $YBa_2Cu_3O_{7-d}$, and there was a problem in the surface flatness. Further, $YBa_2CU_3O_{7-d}$ does not have a good lattice matching performance with $PrBa_2Cu_3O_7$. In oxide superconductors, the lattice strain is known to cause the increase of oxygen loss, and to deteriorate the superconducting characteristics. The Tc of an a-axis orientated film on a $SrTiO_3$ single crystal substrate decreases to a lower value by the effect of the strain. The stress is stored in the interior of the multilayer film of $YBa_2Cu_3O_{7-d}$ and $PrBa_2Cu_3O_7$, and makes it difficult to gain a high quality superconducting characteristics.

The inventors of the present invention have proposed an oxide superconducting Josephson element comprising a layered structure depositing an oxide superconducting thin-film and a non-superconducting thin-film layers alternately as the junction portion formed on the substrate (Japanese Patent Application Laid-Open No. 8-156627).

The oxide superconducting thin-film is a $M'Ba_2Cu_3O_7$ thin-film (where M' is an element of one or a combination of more then two rare earth elements such as Nd, Sm, and Eu), and the non-superconducting thin-film is a $M''Ba_2Cu_3O_7$ thin-film (where M'' is either Pr or Sc, or a combination of these elements).

The analysis on the behavior of a superconducting element in a magnetic field including the above-mentioned oxide superconducting Josephson element was aimed mainly to the analysis of the behavior in a weak magnetic field, and almost no study was performed on the characteristics in a strong magnetic field.

It is well known that when an electromagnetic wave of a frequency f was applied to a Josephson element, a step appears in the current-voltage characteristics. The size of the voltage V of the step is proportional to the frequency f, and will be determined by the following relationship:

$$V=(h/2e)f$$

In the equation, h represents Planck's constant, and e represents the charge of electron.

Therefore, when the frequency f is accurately known, then the voltage V could be calculated precisely. By utilizing such relations, a voltage standard could be made.

SUMMARY OF THE INVENTION

The present invention is based on the discovery that the oxide superconducting Josephson element proposed above showed a unique characteristics when analyzing the current-voltage characteristics in a high magnetic field. That is, by forming a layered structure having a small inner stress with a $PrBa_2Cu_3O_7$ layer which is a non-superconductor positioned in the center, and a superconductor $NdBa_2Cu_3O_7$ having a close lattice constant being selected to be deposited, the structure shows a voltage step generated at regular bias current intervals to the current-voltage characteristic curve in a magnetic field. The present invention is aimed to a superconducting device applying this voltage step.

The present invention relates to a superconducting regular current interval voltage step element: an oxide superconducting element having a layered structure which includes an oxide superconducting thin-film and a non-superconducting thin-film layer being deposited on a substrate. The current-voltage characteristic curve in a magnetic field includes a voltage step generated at regular bias current intervals.

Further, the layered structure is formed by alternately depositing a $M'Ba_2Cu_3O_7$ thin-film (where M' is one or a combination of more than two elements of Nd, Sm and Eu) and a $M''Ba_2Cu_3O_7$ thin-film (where M'' is either Pr or Sc, or an element combining the two).

Furthermore, the present invention is related to a superconducting device comprising a superconducting element and utilizing a current-voltage characteristic showing a voltage step generated at regular bias current intervals in a magnetic field. The superconducting element is the above-mentioned superconducting regular current interval voltage step element.

BRIEF DESCRIPTION OF THE DRAWINGS

FIG. 6 is an explanatory view of the current-voltage characteristics of the element in a magnetic field according to embodiment 2.

PREFERRED EMBODIMENT OF THE INVENTION

Figure 1A:
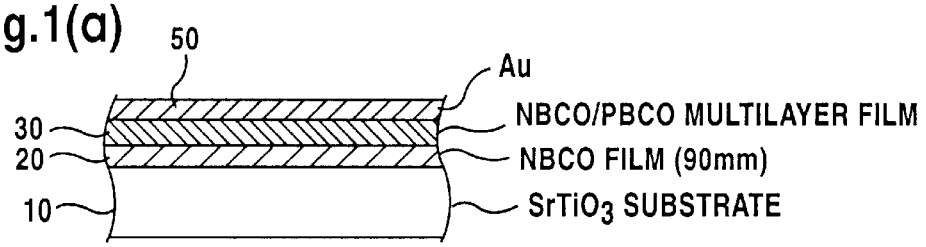
FIG. 1 is an explanatory view showing one simplified example regarding the manufacturing step of the superconducting regular current interval voltage step element according to the present invention.

The embodiment on the superconducting regular current interval voltage step element of the present invention will be explained. The explanation is merely on a representing example, and it is not intended to limit the superconducting regular current interval voltage step element and the superconducting device disclosed in the claims.

The superconducting regular current interval voltage step element has a low carrier density. Since the oxygen content is strongly related to the lattice strain, oxygen loss will be caused in the state where strain is added, and the superconductive characteristics will be deteriorated. Further, when combining different materials to form a layered structure, the difference in the lattice constant or the thermal expansion rate causes a generation of an inner strain from the junction interface. This not only weakens the mechanical strength of the element, but also degrades the oxide superconducting characteristics. Therefore, when manufacturing a superconducting element having such layered structure, it is important to minimize the strain in order to realize a high performance superconductivity. The present invention was discovered by studying the characteristics in a high magnetic field of a superconducting element manufactured as described above.

(Embodiments)
Embodiment 1

FIG. 1 shows the concept of one example regarding the manufacturing steps of the superconducting regular current interval voltage step element according to the present invention. The manufactured superconducting regular current interval voltage step element comprises on a $SrTiO_3$ single crystal substrate 10 a layered structure 30 formed of a $NdBa_2Cu_3O_7$ (NBCO) thin-film as an oxide superconductor and a $PrBa_2Cu_3O_7$ (PBCO) thin-film as a non-superconductor, wherein the current-voltage characteristic curve in a magnetic field includes a voltage step generated at regular bias current intervals.

In order to fabricate the superconducting regular current interval voltage step element of embodiment 1, a NBCO thin-film (lower electrode) 20 is deposited by a laser ablation method on the upper surface of a $SrTiO_3$ single crystal substrate 10. A NBCO polycrystal is used as the target, the substrate temperature is set to 790° C., the oxygen partial pressure is 100 mTorr, the growing time is about two minutes, and the manufactured film thickness is 30 nm. The utilized laser is an excimer laser of KrF, with a wave length of 248 nm, and energy density of $5J/cm^2$. Thereafter, the PBCO thin-film is deposited. As a target, a PBCO polycrystal inside the same chamber is used. The thin-film deposition condition is similar to that of the NBCO thin-film where the substrate temperature is 790° C., the oxygen partial pressure is 100 mTorr, the growing time is three minutes, and the film thickness is about 50 nm. The above steps are repeated alternately so as to manufacture a multilayer film 30. In the example of embodiment 1, the steps were repeated for three times in order to gain the layered structure of NBCO/PBCO/NBCO. On top of the layered structure, a gold layer 50 is deposited.

Figure 1B:
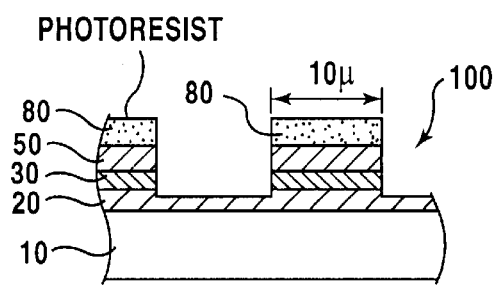

Next, a photoresist insulating film 80 is deposited, and by using conventional photo-lithography and Ar ion etching, the portions other than the 10 $\mu$m square area of the lower electrode 20 are removed. The 10 $\mu$m square area becomes the junction, which is shown in FIG. 1(b).

Figure 1C:
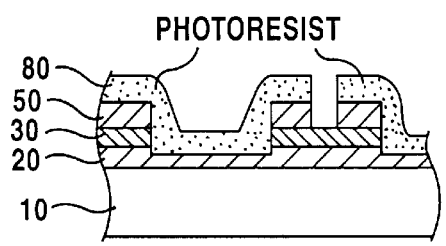
Figure 1D:
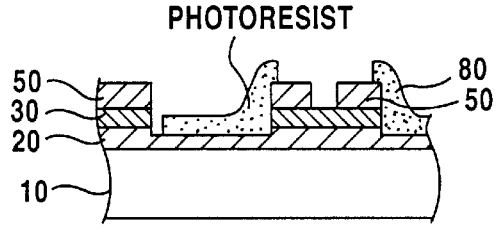

A photoresist insulating film 80 is formed again to manufacture the gold electrode 50, and one portion of the photoresist insulating film 80 is removed to form the gold electrode 50, which is shown in FIG. 1(c). Then, the area other than the insulating portion is removed in the photoresist insulating film 80, which is shown in FIG. 1(d).

Figure 1E:
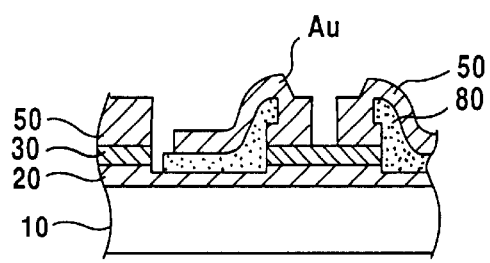

Further, a wire is bonded to the gold electrode 50, as shown in FIG. 1(e) This is for measuring the current-voltage characteristics by the four terminal method.

Figure 2:
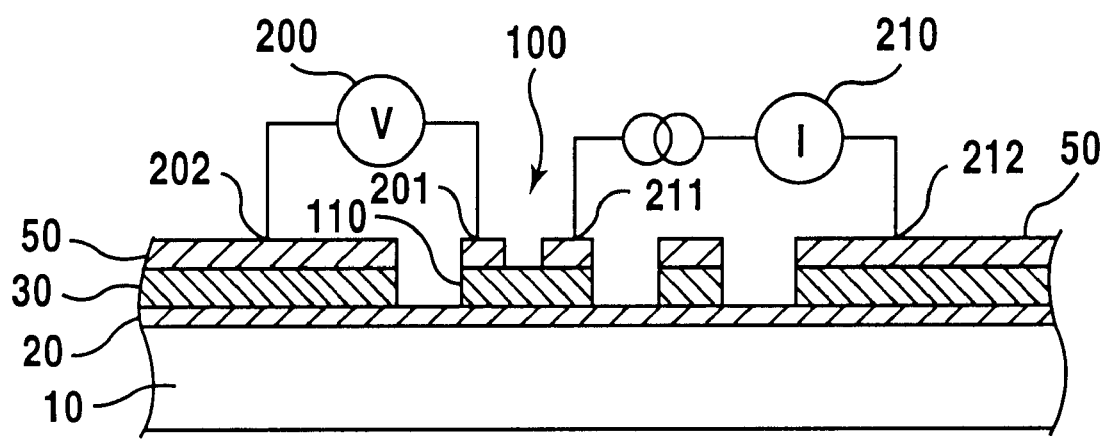
FIG. 2 is an explanatory view of the device for obtaining a current-voltage characteristic of the element by a four terminal method.

FIG. 2 is an explanatory view on how to use the device for obtaining the current-voltage characteristics of the element according to embodiment 1 of the present invention which is manufactured as above.

On the gold electrode of the junction portion 100 is contacted a first terminal 201, and on another gold electrode which is separate from the junction portion 100 is contacted a second terminal 202, wherein the voltage is measured by a voltmeter 200.

On the other gold electrode of the junction portion 100 is contacted a third terminal 211, and on another gold electrode which is separate from the junction portion 100 is contacted a fourth terminal 212, the current is supplied from a function generator.

Figure 3:
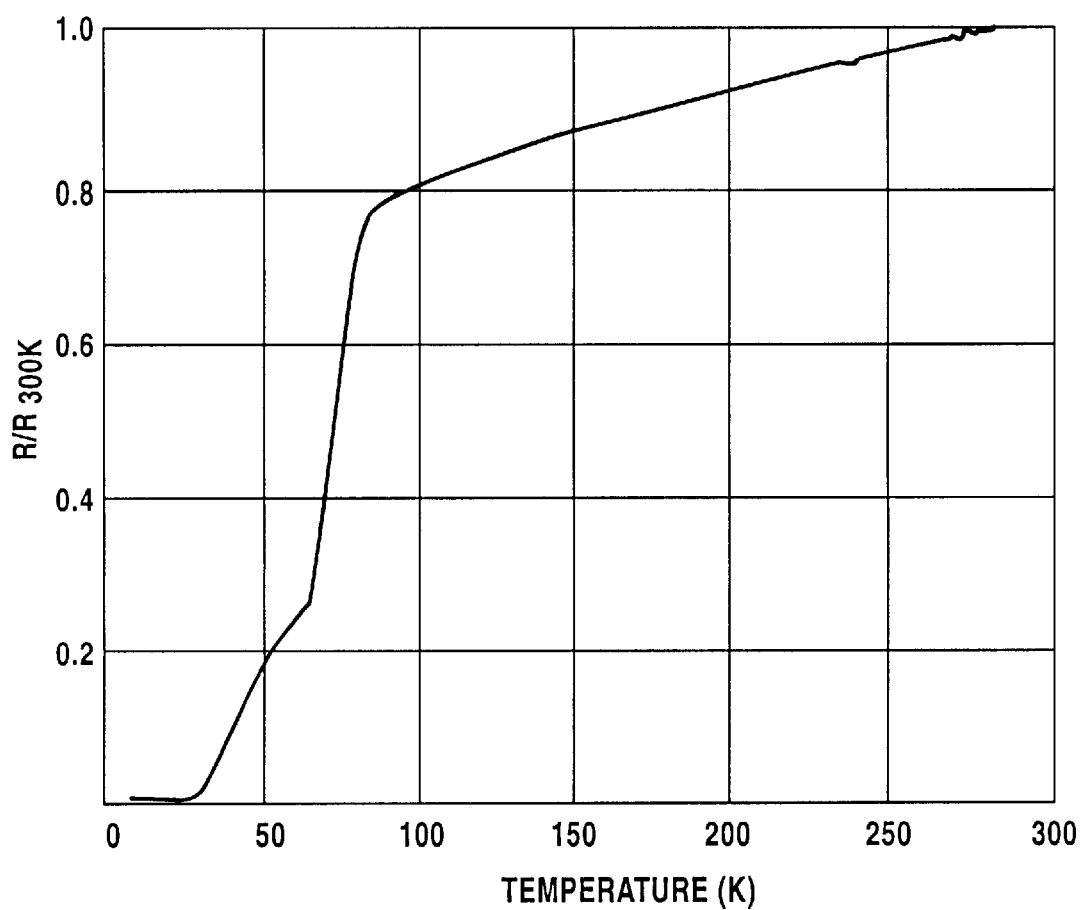
FIG. 3 is an explanatory view of the temperature dependency of the electric resistance in the manufactured element.
Figure 4:
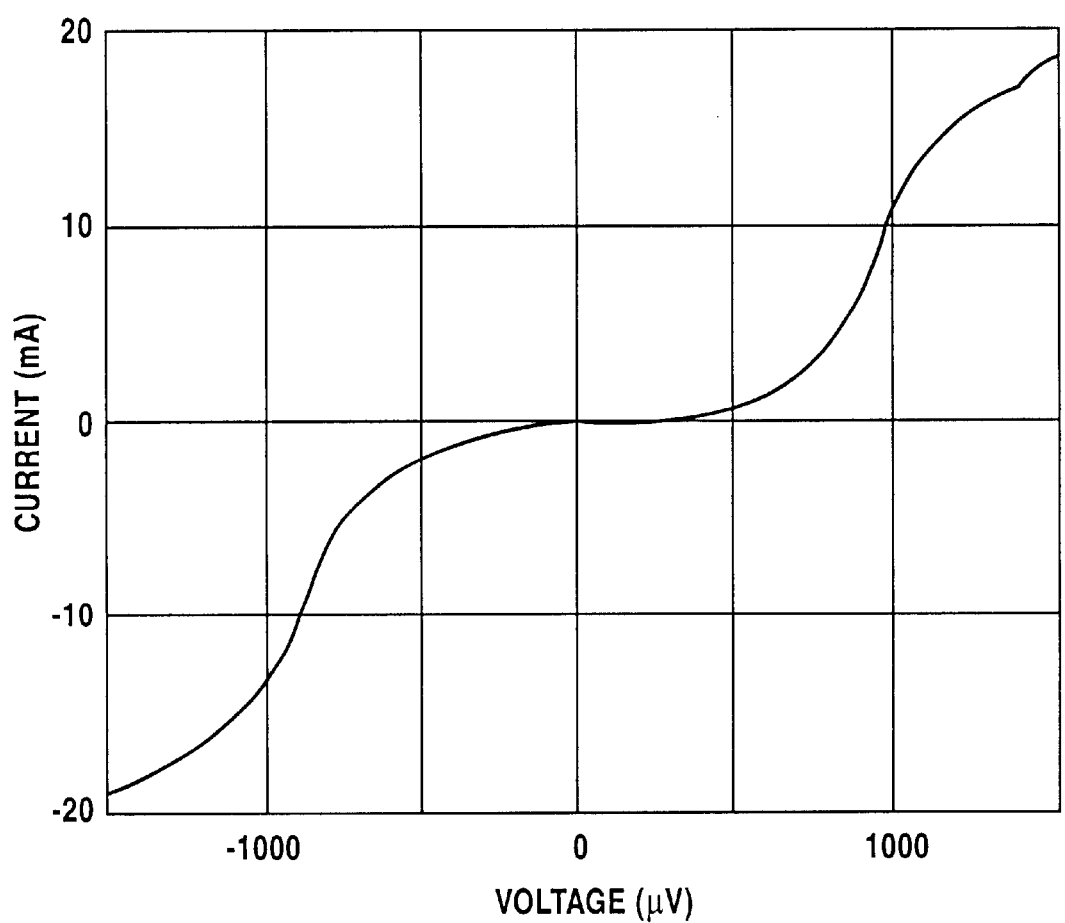
FIG. 4 is an explanatory view of the measurement result regarding the current-voltage characteristics of the manufactured element at 11 K.
Figure 5A:
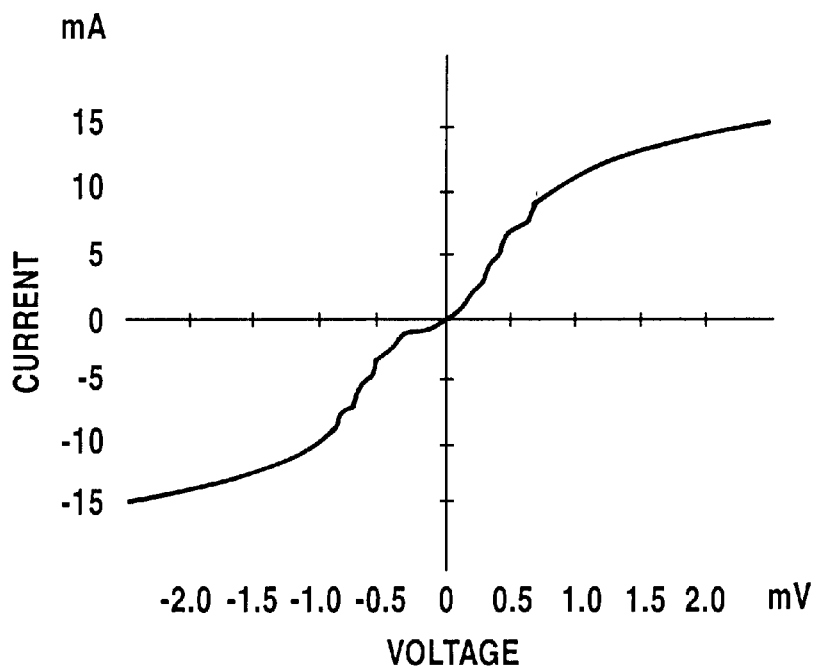
FIG. 5 is an explanatory view of the current-voltage characteristics of the element in a magnetic field according to embodiment 1.
Figure 5B:
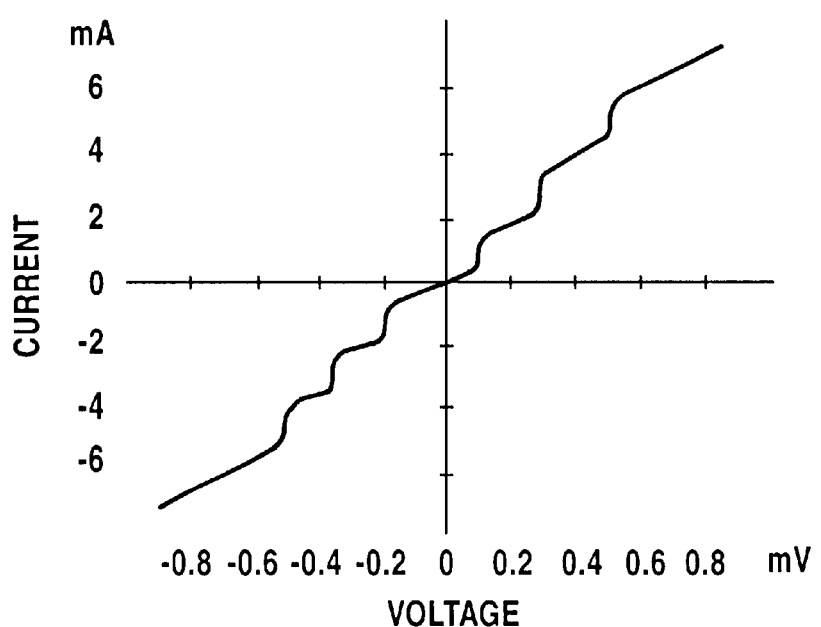

FIG. 3 shows the temperature characteristics in the electric resistance of the element being manufactured by embodiment 1 of the present invention, the horizontal axis represents the temperature (K), and the vertical axis represents the resistance normalized to the resistance value at a temperature of 300 K. FIG. 4 shows the result where the current-voltage characteristics at 11K in the absence of a magnetic field is measured by a four terminal method. According to the drawing, the current of the manufactured element is rapidly increased at 750 $\mu$V corresponding to a superconducting tunnel current and a superconducting energy gap voltage. FIGS. 5(a) and 5(b) show the measurement on the current-voltage characteristics of the superconducting element according to embodiment 1 in which a high magnetic field of 7T was applied. FIG. 5(b) is an enlarged explanatory view of FIG. 5(a). A difference in level (step) appears in a specific voltage level (approximately 0.5 mV). The intervals of the voltage value are not regular, and they are thought to be generated by the Zeeman effect of the magnetic field. On the other hand, the current value where the voltage step is generated is at even intervals, which is 3 mA. This phenomenon relates to a current and magnetic field, or Lorentz force, and regarded to be caused by the movement of the magnetic flux quantum.

Embodiment 2

The element is manufactured basically by the steps similar to that of embodiment 1. The superconducting regular current interval voltage step element of embodiment 2 comprises a layered structure of a $SmBa_2Cu_3O_7$ thin-film which is an oxide superconductor and a $ScBa_2Cu_3O_7$ thin-film which is a non-superconductor formed on a $SrTiO_3$ single crystal substrate. The current-voltage characteristic curve of the element in a magnetic field comprises a voltage step generated at regular bias current intervals.

In order to manufacture a superconducting regular current interval voltage step element of embodiment 2, a $SmBa_2Cu_3O_7$ thin-film is formed on the whole upper surface of a $SrTiO_3$ single crystal substrate by a sputtering method. As the thin-film manufacturing condition, a $SmBa_2Cu_3O_7$ polycrystal is used as the target, the substrate temperature is 740° C., the ambient pressure is 84 mTorr, the oxygen gas flow is 0.5 sccm and the argon gas flow is 10 sccm, the growing time is three minutes and the film thickness is 25 nm. The used RF power was 80 W. A $ScBa_2Cu_3O_7$ thin-film is manufactured on the whole surface of the substrate by a sputtering method. As the manufacturing condition, a $ScBa_2Cu_3O_7$ polycrystal is used as the target, the substrate temperature is 740° C., the deposition pressure is 84 mTorr, the oxygen gas flow is 0.5 sccm and the argon gas flow is 10 sccm, the deposition time is seven minutes and the film-thickness is 55 nm. By repeating the above steps alternately, a multilayer film is manufactured. The area other than a 10 $\mu$m square portion and a lower electrode 20 is removed by a common photo-lithography and Ar ion etching. The 10 $\mu$m square portion becomes the junction area. Next, an insulating film is formed, and by partially removing the film, a gold electrode is formed. Further, a wire is bonded to the gold electrode. This is for measuring the current-voltage characteristics by a four terminal method. As for this junction portion, a current-voltage characteristics which is similar to that of embodiment 1 could be observed, as shown in FIGS. 6(*b*) and 6(*c*). FIG. 6 is an explanatory view of the current-voltage characteristics and shows the state where no magnetic field is applied FIG. 6(*b*) shows the state where the temperature is 11 K and the magnetic field is 4T, and FIG. 6(*c*) shows the state where the magnetic field is 7T. A voltage step appears in a specific voltage level (approximately 0.5 mV). The intervals of the voltage value is not regular, but the current value where the voltage step is generated is at even intervals, which is approximately 1 mA. Similarly as the superconducting regular current interval voltage step element of embodiment 1, it could be seen that a tunnel type junction is manufactured by the present embodiment. Such junction of the superconducting regular current interval voltage step element according to embodiment 2 is considered to be generated by the Zeeman effect caused by the magnetic field.

The superconducting regular current interval voltage step elements according to embodiments 1 and 2 both show a current-voltage characteristic curve in a high magnetic field having a voltage step being generated at regular bias current intervals. Therefore, the elements could be applied to a superconducting device utilizing the current-voltage characteristic curve.

The example showed above referred to as a layered structure of a $NdBa_2Cu_3O_7$ thin-film and a $PrBa_2Cu_3O_7$ thin-film, and a layered structure of a $SmBa_2Cu_3O_7$ thin-film and a $ScBa_2Cu_3O_7$ thin-film as examples of layered structures by depositing alternately $M'Ba_2Cu_3O_7$ (where M' is one or a combination of more than two kinds of elements of Nd, Sm, and Eu) which is a high Tc oxide superconductor and a $M''Ba_2Cu_3O_7$ thin-films (where M'' is either Pr or Sc, or a combination of the two elements) which is a non-superconductor. The present inventors confirmed that other layered structures also showed the same characteristics in a high magnetic field, which is considered to be caused by the Zeeman effect.

As was shown by the embodiments, the oxide superconducting element comprises a voltage step being generated at regular bias current intervals in the current-voltage characteristic curve in a magnetic field, and in order to show such characteristics, the thickness of the film should be 30 nm or less. This value depends strongly on the film quality, and in the future when thin-films having small defects could be manufactured, it is predicted that the thickness of the film could be larger.

What is claimed is:

1. A superconducting element comprising, in a magnetic field, a layered structure of an oxide superconducting thin-film and a non-superconducting thin-film layer formed on a substrate having a current-voltage characteristic of a voltage step being generated at regular bias current intervals, wherein said magnetic field has a value of at least 4T.

2. A superconducting element according to claim 1, wherein the layered structure includes alternate thin films of $M'Ba_2Cu_3O_7$ wherein M' is at least one of Nd, Sm or Eu, and $M''Ba_2Cu_3O_7$, wherein M'' is either Pr or Sc, or a combination of the two elements.

3. A superconducting device comprising a superconducting element according to claim 1, using the current-voltage characteristic of the voltage step being generated at regular bias current intervals in high magnetic fields.

4. A superconducting device comprising a superconducting element according to claim 2, using the current-voltage characteristic of the voltage step being generated at regular bias current intervals in high magnetic fields.

5. A superconducting element according to claim 1 wherein the non-superconducting thin-film layer is positioned as a center layer of said layered structure.

* * * * *